United States Patent [19]

[11] 4,350,903

[45] * Sep. 21, 1982

Jimerson et al.

[54] ELECTRONIC LIGHT SWITCH

[76] Inventors: Bruce D. Jimerson, 6415 Corsini Pl., Rancho Palos Verdes, Calif. 90274; Henry H. Nakasone, 1672 Camrose Way, Anaheim, Calif. 92802

[ * ] Notice: The portion of the term of this patent subsequent to May 1, 1996, has been disclaimed.

[21] Appl. No.: 33,864

[22] Filed: Apr. 27, 1979

Related U.S. Application Data

[63] Continuation-in-part of Ser. No. 768,544, Feb. 14, 1977, Pat. No. 4,152,608.

[51] Int. Cl.$^3$ .......................... H03K 17/60; G05F 1/00

[52] U.S. Cl. .......................... 307/252 B; 307/252 N; 307/247 A; 315/194

[58] Field of Search ............ 307/265, 252 UA, 252 R, 307/247 R, 247 A; 315/195, 194

[56] References Cited

U.S. PATENT DOCUMENTS

| | | | |
|---|---|---|---|
| 3,909,635 | 9/1975 | Maida | 307/247 A |
| 3,950,657 | 5/1976 | Sheng et al. | 307/252 UA |
| 4,112,318 | 9/1978 | Hamelink | 307/247 R |
| 4,152,607 | 5/1979 | Nakasone | 307/252 |
| 4,152,608 | 5/1979 | Nakasone | 307/252 |

*Primary Examiner*—Stanley D. Miller, Jr.
*Assistant Examiner*—B. P. Davis

[57] ABSTRACT

The specification discloses an electronic switch for operating an incandescent lamp from a plurality of stations. A plurality of normally closed mechanical switches may be wired in series with the lamp, and electronic switch to form a single series circuit. Actuation of any single mechanical switch interrupts the power, causing the electronic switch to change its state. Additional circuitry for dimming and state preservation in the event of a complete power failure are also disclosed. The rate at which power is applied or reduced may be varied in accordance with circuit values.

8 Claims, 5 Drawing Figures

ELECTRONIC LIGHT SWITCH

CROSS-REFERENCES TO RELATED APPLICATIONS

This is a continuation-in-part of an earlier application filed Feb. 14, 1977, Ser. No. 768,544 now U.S. Pat. No. 4,152,608 filed May 1, 1979 by Bruce D. Jimerson and Henry H. Nakasone, entitled: Momentary Contact Light Switch. The contents of that application are incorporated herein by reference.

BACKGROUND OF THE INVENTION

1. Field of the Invention

The invention relates to soft switches which can be used with existing household wiring arrangements to effect control from any number of separate stations. The contents of the patents and patent applications referenced in the aforementioned parent case (Ser. No. 768,544) are incorporated herein by reference for the purpose of providing background information.

2. Description of the Prior Art

The concept of soft switching, i.e., gradual "turn-on" and "turn-off", and multiple station control using standard wiring has been disclosed in the parent case and previous patents by the same inventors.

These prior art circuits are, however, complicated. In addition, they do not have the capability of recovering to a previous state if a total power failure occurs. They also suffer from the effects of line voltage changes, particularly with regard to the time delays which occur during turn-on. What is actually desired, therefore, is a simpler and more reliable circuit for achieving soft switching, touch control circuitry whose characteristics are not dependent upon normal line voltage changes, and the state of which is not effected by power failures. In addition, it is desirable to provide an embodiment of the invention which increases the power gradually, thereby extending lamp life, but rapidly enough to provide the appearance of instantaneous "turn-on". It is of further advantage to provide such embodiments with dimming capabilities, whose operation does not effect the turn-on and turn-off characteristics.

Accordingly, a primary object of the invention is to provide a simplified momentary contact light switch which can be used to replace a conventional mechanical toggle switch at any number of control stations.

Another object of the invention is to provide a momentary contact light switch which does not utilize relays or other mechanical devices to retain its state in the event of a power failure.

A further object of the invention is to provide an electronic switch which will reliably respond to the actuation of any number of normally closed series connected mechanical switches.

Another object of the invention is to provide a simplified electronic switch which will eliminate the need for three-way wiring arrangements to effect control of a light from a plurality of separate stations.

Another object of the invention is to provide a zero delay soft switch, which will produce a gradual change in the amount of A.C. power applied to a load immediately following the depression of any one of a plurality of series connected momentary contact switches.

Another object of the invention is to provide gradual "turn-on" and "turn-off" characteristics which are independent of normal line voltage changes.

Another object of the invention is to provide an electronic switch which progressively increases the application of power at a rate which protects lamp filaments, but which provides the appearance of instantaneous or nearly instantaneous "turn-on".

A further object of the invention is to provide an electronic switch and dimmer control which can be turned "on or off" at a remote station.

Another object of the invention is to provide a delayed mechanical shunt across the control element of an electronic switch.

Other objects and advantages of the present invention will be obvious from the detailed description of a preferred embodiment given hereinbelow.

SUMMARY OF THE INVENTION

The aforementioned objects are realized by the present invention which comprises one or more normally closed, unbypassed momentary contact switches. The control circuit, (which may physically be located at any one of the switch stations) comprises a power supply, a bistable multi-vibrator (or Flip-Flop) and a variable conduction angle circuit. The power supply generates a D.C. voltage for operating the Flip-Flop. Depression of any series switch momentarily removes power from the circuit which compliments the Flip-Flop, the latter functioning to allow the variable conduction angle circuit to commence a progressive increase (if the lamp was initially "off") or to abruptly cut off conduction during one polarity, followed by a gradual decrease in the conduction angle during the other polarity (if the lamp was initially "on"). Alternative embodiments provide for optional state storage and dimming capability.

DETAILED DESCRIPTION OF A PREFERRED EMBODIMENT

Figure 1:
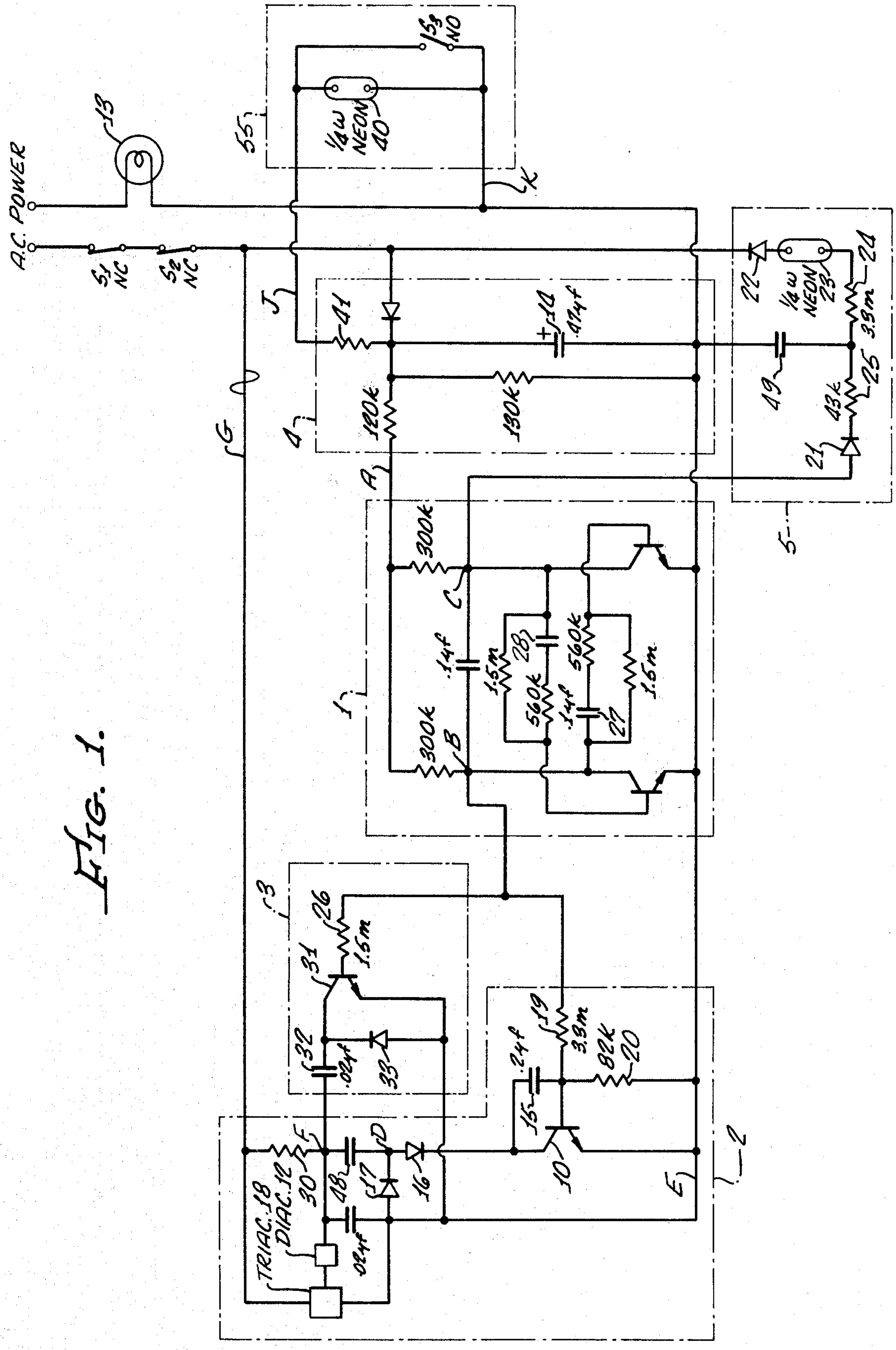
FIG. 1 shows a schematic diagram of the preferred embodiment of the invention.

Adverting to the drawings, and particularly FIG. 1, a preferred embodiment of the invention comprises a Flip-Flop 1, a DC power supply 4, and a variable conduction angle circuit 2. Optionally, the invention may include a state storage circuit 5 and/or a "hold-off" circuit 3. The function and operation of each of these circuits are described below.

The Flip-Flop circuit 1 is designed so that it will compliment (change state) whenever the voltage at point A abruptly decreases. In the "off" state the voltage at point A is approximately 60 volts DC. Point B will be high, and point C will be low, so that transistor 10 will be conducting so as to maintain point D at approximately the same potential as point E. Under these conditions, the AC voltage at point F is insufficient to "break-down" diac 12, therefore, triac 18 does not conduct during any part of the AC cycle (shown on line G). To cause the light 13 to turn "on", either of the normally closed series switches $S_1$ or $S_2$ can be momentarily depressed so as to interrupt the voltage which maintains the charge on capacitor 14. This causes the voltage at point A to abruptly drop—thus, complimenting Flip-Flop 1 to the "on" state. The voltage at point B is then approximately equal to that of point E, so that transistor 10 is turned "off". This allows capacitor 15 to charge through diode 16 during each positive half cycle. Transistor 10 and capacitor 15 form an integrating circuit which produces a gradual turn-on effect which lasts several seconds. When capacitor 15 is fully charged, the phase delay of capacitor 48 is eliminated—so that triac 18 turns "on" near the beginning of each half cycle.

To turn the light 13 "off", either $S_1$ or $S_2$ (or any other series connected switch not shown) can be actuated to momentarily interrupt the AC—and abruptly decrease the potential at point A. This returns Flip-Flop to its original "off" state, so that capacitor 15 begins to discharge at a rate determined by the resistors 19 and 20. As capacitor 15 discharges, the voltage at point D decreases—thus causing the breakdown of diac 12 to occur at progressively later times during each half cycle. When capacitor 15 is fully discharged, the potential at point D will again be equal to that at point E, and the light 13 will be "off".

An important advantage of the present configuration lies in its simplicity. The switches $S_1$ and $S_2$ need not be bypassed with diodes. Moreover, the need for schmidt triggers, level detectors, and polarity sensing circuitry is eliminated. An additional advantage lies in the utilization of transistor 10 as an integrator—the magnitude of the delay achieved by connecting a 0.2 $\mu$f capacitor between the collector and base of transistor 10 is comparable to that achieved by a 10 $\mu$f capacitor connected between the collector and ground.

In addition to the above improvements in the basis circuitry, there is also shown a state storage circuit 5. The purpose of this circuit is to provide a non-destructive memory of the state of Flip-Flop 1 in the event of a total power failure. In such a case, it is desirable to have the lamp return to the same state when power resumes. This is effectuated by state storage capacitor 49, which is charged through diode 21 whenever point C is high—and discharged through resistor 24, neon 23 and diode 22 whenever point C is low. If a power failure occurs when point C is low—capacitor 49 functions to pull down point C through resistor 25—causing the Flip-Flop 1 to "power-up" in the "light-off" state. If power is lost at a time when capacitor 20 is charged, it will remain charged (since the discharging current through diode 22, neon 23 and resistor 24 will also cease when the power is lost). This charged state will continue—subject only to gradual discharge due to leakage through the back resistance of diode 21. When power is reapplied, point B will be pulled down by resistors 19 and 26—thus causing Flip-Flop 1 to "power-up" in the "light-on" state. It will be understood, however, that the state storage circuitry does not effect the normal operation of Flip-Flop 1 which is dependent upon the residual charges left on capacitors 27 and 28 by the momentary interruption of power vis-a-vis actuation of $S_1$ or $S_2$. In other words, the charge on capacitors 27 and 28 predominate over the less influential effects of the state storage circuit 5. It is only after the power has been removed for several seconds (i.e., a sufficient time for capacitors 27 and 28 to be discharged) that the state storage circuitry operates to return the Flip-Flop 1 to its pre "power-down" state.

The hold off circuit 3 provides an additional advantage in that it eliminates any turn-on delays due to voltage changes. If, for example, the resistor 30 is chosen large enough to prevent breakdown of diac 12 when the line voltage is at a maximum (e.g., 130 volts RMS), then there will be a small delay (approximately $\frac{1}{4}$ to $\frac{3}{4}$ of a second) before the light begins to "turn-on" at low line voltage levels (e.g., 105 volts RMS). To eliminate this delay, the resistor 30 is chosen so as to produce zero delay at low time voltages. Transistor 31 and diode 33 function through capacitor 32 to decrease the voltage at point F to prevent diac 12 from breaking down when the line voltage is high.

Where the Electronic Switch is used to operate a table lamp, it can be built into a small module which plugs into a standard wall outlet. In the case of a night stand table lamp, it is convenient to control the lamp from both the bed and wall switch. If the Electronic Switch plugs into the same outlet as the night lamp, a set of low current wires can be used to actuate the circuit. Such an arrangement is depicted by the dotted module 55 which incorporates a small $\frac{1}{4}$ watt neon night light and a normally open momentary contact switch $S_3$. This module can be located at a convenient place (e.g., attached to the headboard or night stand—where it is easily located by the light from the neon). It is connected through low current wires J and K and resistor 41 to the main module at the AC outlet. When $S_3$ is depressed, the potential at point A is abruptly reduced, causing Flip-Flop 1 to change state. The light 13 can thus be controlled from $S_3$ as well as $S_1$ and $S_2$.

Figure 2:
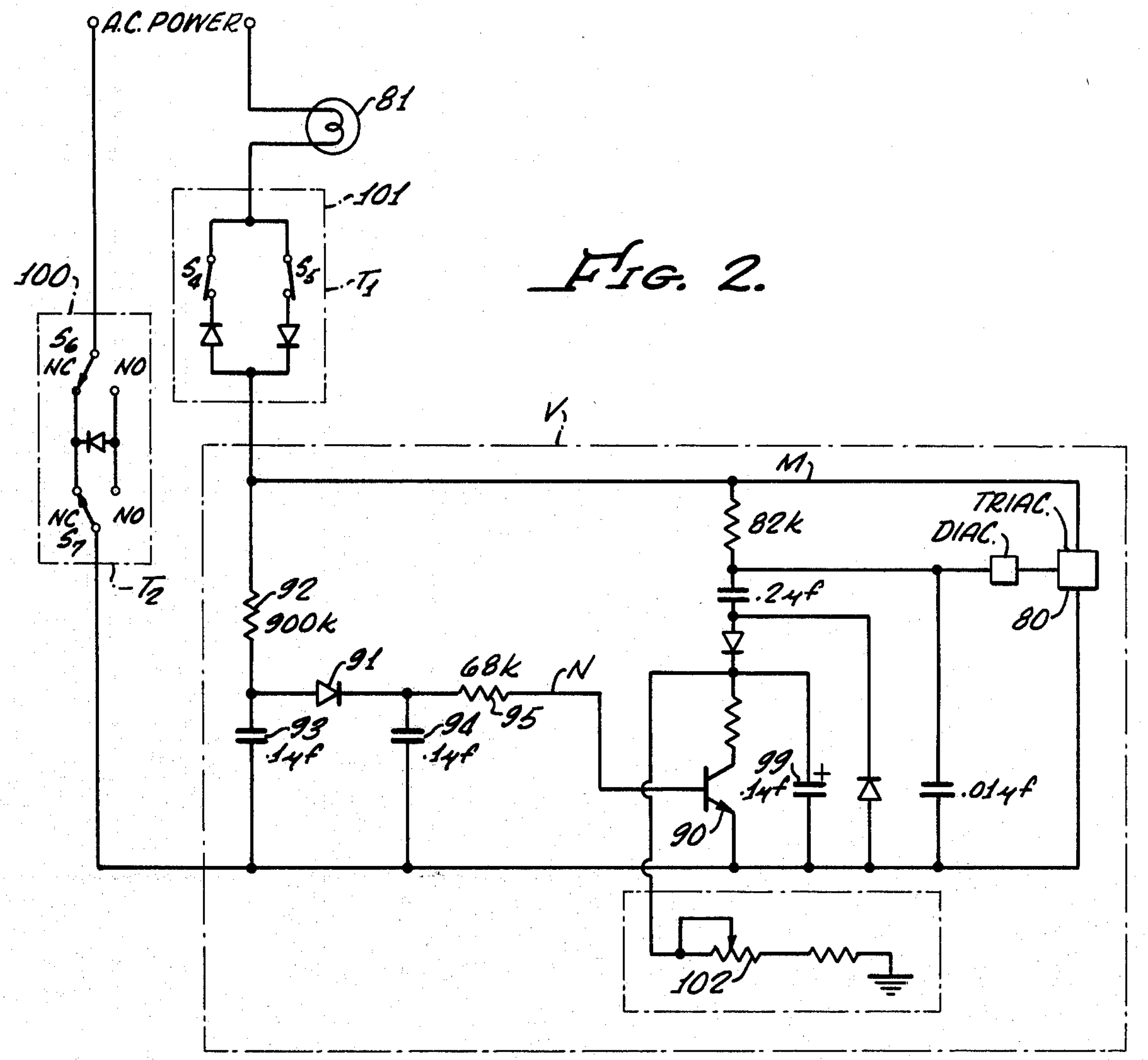
FIG. 2 shows a schematic diagram of an alternative embodiment employing dimming.

FIG. 2 shows an alternative embodiment which does not require a Flip-Flop or the generation of a DC voltage to operate it. Two forms of switches (T1 and T2) are illustrated—both function to interrupt one polarity or the other depending upon which mechanical switch ($S_4$, $S_5$ or $S_6$, $S_7$) is operated. In the "off" state, transistor 90 is maintained in the conducting mode by virtue of diode 91, resistor 92, capacitors 93 and 94, and resistor 95. When the positive potential is interrupted (by momentarily depressing either $S_5$ or $S_6$), transistor 90 ceases to conduct, and capacitor 99 rapidly charges to its maximum value, thus permitting triac 18 to conduct near the beginning of each half cycle. The drop across lamp 81 reduces the potential at point M to a point such that the signal at N will be of insufficient magnitude to cause transistor 90 to conduct after actuation of $S_5$ or $S_6$ is terminated. The lamp 81 is thus turned on in a time interval which appears almost instantaneous—but which in fact requires some 20 to 30 cycles. This time is more than ample to reduce the surge current which would result if the full voltage is instantaneously applied to the lamp filament.

Turn "off" is accomplished by depressing either $S_4$ or $S_7$ in order to interrupt the negative half cycle. When this occurs, the voltage at point N builds up positively with each half cycle until transistor 90 conducts. When this occurs, the lamp 81 is abruptly returned to the "off" state.

The circuit shown in FIG. 2 may also include a dimmer potentiometer 102 for manually decreasing the lamp intensity. Since the circuit of FIG. 2 appears to cause the lamp to change state almost instantaneously, the "turn-on" and "turn-off" characteristics and unefected by the potentiometer setting. Thus, if potentiometer 102 is adjusted so as to decrease the lamp intensity by $\frac{1}{2}$ of full brightness, actuation of $S_5$ or $S_7$ will simply cause the lamps to abruptly change from off to $\frac{1}{2}$ brightness. Similarly, when $S_4$ or $S_7$ is actuated, the lamp intensity will abruptly drop from ½ brightness to completely "off". Although a dimming potentiometer may be added to the circuit shown in FIG. 1, the turn-on and turn-off characteristics are sometimes confusing, i.e., "turn-on" causes the lamp intensity to increase in brightness until the dimming level is reduced—whereas turn-off begins at a lesser intensity, thereby decreasing turn-off time. Since these "items" are imperceptibly short using the configuration shown in FIG. 2, there is no need to compensate for these effects with additional circuitry.

Figure 3:
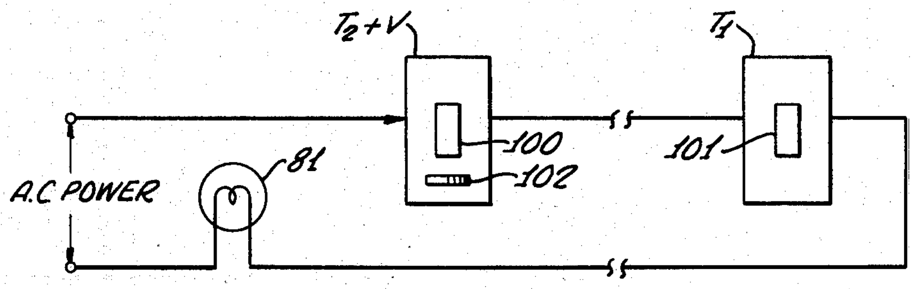
FIG. 3 shows the physical arrangement between a pair of wall switches incorporating the circuitry of FIG. 2.

FIG. 3 shows a typical application of the concepts illustrated in FIG. 2. Both locations use a rocket type wall switch which functions to open a set of contacts so as to interrupt either the positive or negative half cycle of the AC line power. In addition, one station includes the circuitry "V" of FIG. 2. Thus, if the rocker switch 100 operates $S_7$ when pressed at the bottom, it will turn "off" the lamp 81. If rocker switch 100 operates $S_6$ when pressed at the top, it will turn the lamp 81 "on". Similarly, if rocker switch 101 operates $S_4$ when pressed at the bottom, it turns off lamp 81, and if rocker switch 101 operates $S_5$ when pressed at the top, it will turn "on" lamp 81. In either case, lamp 81 will only "turn-on" to an intensity determined by the setting of the thumb wheel (potentiometer 102). It will thus be understood that the electronic switch can be actuated from any number of remote locations so as to turn the lamp "on" to a brilliance determined by the setting of potentiometer 102.

Figure 4:
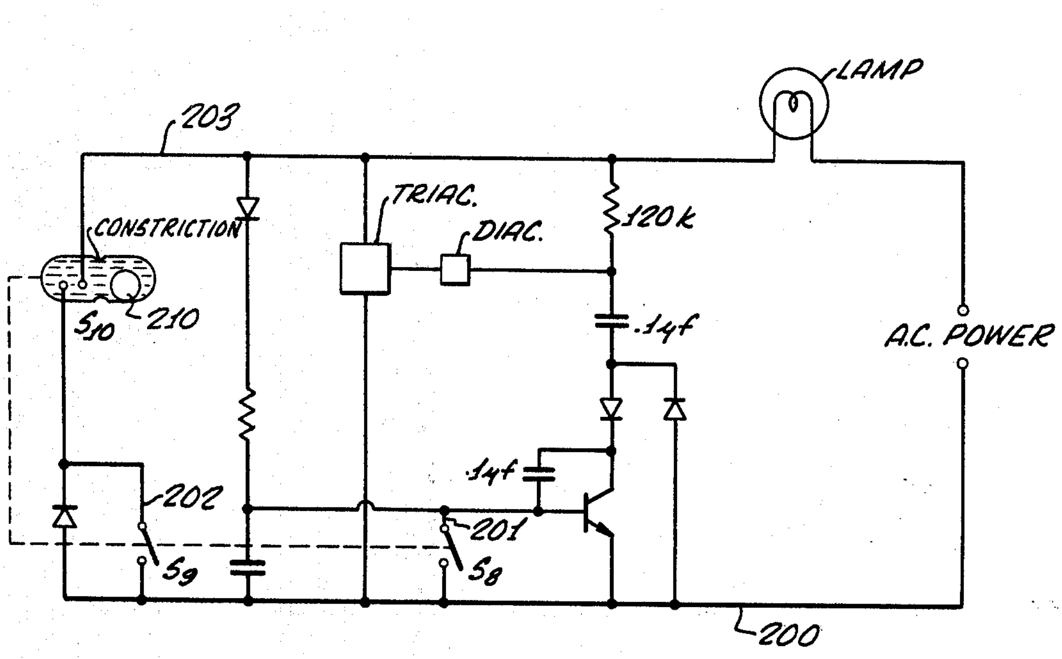
FIG. 4 shows a schematic diagram incorporating a delayed action mechanical switch.
Figure 5:
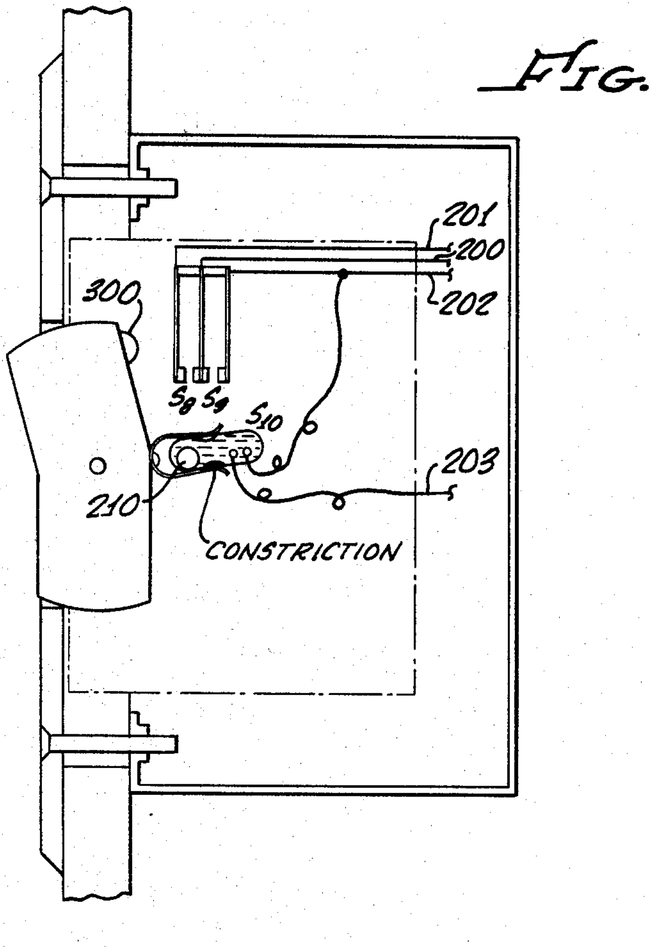
FIG. 5 shows the physical arrangement of a delayed action mechanical switch.

The circuits shown in FIGS. 1 and 2 may also be adapted for use in connection with rocker type mechanical latching switches. In this adaptation, the variable conduction angle circuit is operated directly from the mechanical contact. Referring to FIGS. 4 and 5, it will be apparent that if the values are properly chosen, the triac will remain non-conductive as long as $S_4$ remains open, and that its conduction angle will increase during each cycle of the imput waveform after switch arm 201 of $S_8$ closes. If the triac is shunted by a delayed action mechanical switch, the result will be a gradual turn-on—followed by a total current bypass. In the present case, the delayed mechanical shunt if shown as a mercury switch $S_{10}$ which contains a viscous oil to delay the time required for the memory to make contact with the terminals. The operation of the switch is therefore as follows: Depression of the rocker causes a protrusion 300 to close $S_8$ and $S_9$, thus connecting contacts 201 and 202 with terminal 200. The mercury switch is tipped downwardly where it remains because of mechanical forces, and the mercury 210 commences to roll in the direction of the $S_{10}$ contacts 203 and 202. The conduction angle increases by virtue of the operation of the variable conduction angle circuit until the mercury closes $S_{10}$13 at which point the lamp is "full-on". When the rocker is depressed at the bottom, $S_8$ and $S_9$ open immediately, and the lamp intensity drops to ½. When the mercury leaves the contact $S_{10}$, the lamp extinguishes completely.

Although the basic concepts of the invention have been shown and described as particular circuits, it will be understood that numerous electronic and mechanical devices may be utilized to accomplish similar results within the spirit of the invention. Thus, one might substitute for the variable conduction angle circuit a variety of complex electronic digital chips to achieve a gradual change in the phase time at which a pulse is to be applied to trigger some conductive device. Gradual "turn-on" and "turn-off" might also be achieved using variable delay one shot multivibrators. Thus, although preferred embodiments have been shown and described, it will be understood that the invention is not limited thereto, and that numerous changes, modifications and substitutions may be made without departing from the spirit of the invention,

We claim:

1. A switching apparatus for operating a load from an A-C power source comprising:

a bistable circuit having a first stable state and a second stable state;

a control device connected in series between the power source and load having a high impedance "off" state and a low impedance "on" state;

circuit means responsively connecting said control device in parallel with said bistable circuit for causing said control device to remain in the "off" state during the time said bistable circuit is in a first state, and for causing said control device to periodically switch from the "off" state to the "on" state when said bistable circuit is in a second state;

actuating means connected in series with the power source and the parallel combination of said control device and said bistable circuit for momentarily altering the voltage across said parallel combination to cause said bistable circuit to change from one stable state to the other stable state.

2. The apparatus recited in claim 1 wherein said actuating means comprises:

at least one normally closed mechanical switch;

trigger means connected to said bistable circuit and said normally closed mechanical switch for causing said bistable device to change from one stable state to the other whenever said normally closed mechanical switch means is actuated so as to momentarily interrupt the connection to the power source.

3. The apparatus recited in claim 1 wherein said actuating means comprises means for generating a DC voltage;

means for producing a change in the magnitude of said DC voltage;

means for connecting said bistable circuit to said DC voltage so as to cause said bistable circuit to change states in response to a change in the magnitude of said DC voltage.

4. The apparatus recited in claim 1 including:

means for causing said control device to switch from the high impedance "off" state to the low impedance "on" state at least once during each half cycle of the AC source when said bistable circuit is in its second stable state;

variable conduction angle means connected to said bistable device and said control device for progressively increasing the "on" time of said control device during each successive half cycle of the AC source following a change in the state of said bistable circuit from its first stable state to its second stable state.

5. The apparatus recited in claim 1 including:

means for causing said control device to switch from the high impedance "off" state to the low impedance "on" state at least once during each half cycle of the AC source when said bistable circuit is in its second stable state;

means for manually varying the duration of the "on" time of said control device during each half cycle of the AC source.

6. A gradual "turn-on" switch for applying power to an AC powered load, comprising:

a control device having a pair of main terminals and a control terminal;

circuit means connected to said control terminal of said control device for causing the duration of current flow through the main terminals of said control device to progressively increase during each successive cycle of the AC following actuation of said circuit means to a first state;

actuation means for causing said circuit means to assume a first state, actuation means for causing said circuit means to assume a second state;

circuit means connected to said control terminal of said control device for causing the duration of current flow through the main terminals of said control device to progressively decrease during each successive cycle of the AC following actuation of said circuit means to a second state.

a hold-off circuit means for applying power to the load during the first AC cycle following actuation of said circuit means to a first state.

7. A remote control system for applying AC power to a load comprising:

a first station having a first normally closed momentary switch;

a second station having:

a bistable device;

sensing means for detecting the interruption of power caused by the actuation of said normally closed switch at said first station;

means connecting said sensing means to said bistable device for causing said bistable device to change states whenever said momentary switch is actuated; and control makes having an input terminal responsively connected to the output of said bistable device, and a pair of main terminals in parallel with said bistable device for varying the duration of load current;

conductor means for connecting said main terminals of said control means in series with said first momentary switch, power source and load.

8. The apparatus recited in claim 7, wherein is included at said second station:

a second normally closed momentary switch conductor means for connecting said second normally closed momentary switch in series with said first normally closed momentary switch, control means, power source and load.

* * * * *